United States Patent
Yoon et al.

(10) Patent No.: US 9,761,344 B2
(45) Date of Patent: Sep. 12, 2017

(54) CORE-SHELL NANO PARTICLE FOR FORMATION OF TRANSPARENT CONDUCTIVE FILM, AND MANUFACTURING METHOD OF TRANSPARENT CONDUCTIVE FILM USING THE SAME

(71) Applicant: LG CHEM, LTD., Seoul (KR)

(72) Inventors: Seokhyun Yoon, Daejeon (KR); Seokhee Yoon, Daejeon (KR); Jinmi Jung, Daejeon (KR); Bugon Shin, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/416,593

(22) PCT Filed: Jul. 18, 2014

(86) PCT No.: PCT/KR2014/006522
§ 371 (c)(1),
(2) Date: Jan. 22, 2015

(87) PCT Pub. No.: WO2015/009090
PCT Pub. Date: Jan. 22, 2014

(65) Prior Publication Data
US 2016/0125970 A1    May 5, 2016

(30) Foreign Application Priority Data

Jul. 19, 2013  (KR) .................. 10-2013-0085654

(51) Int. Cl.
*H01B 1/08* (2006.01)
*H01L 31/0224* (2006.01)
*H01B 1/02* (2006.01)
*B82Y 30/00* (2011.01)

(52) U.S. Cl.
CPC ............ *H01B 1/08* (2013.01); *H01B 1/02* (2013.01); *H01L 31/022466* (2013.01); *H01L 31/022475* (2013.01); *B82Y 30/00* (2013.01)

(58) Field of Classification Search
CPC .............................................. H01L 31/022475
See application file for complete search history.

(56) References Cited

U.S. PATENT DOCUMENTS

| 2006/0197092 A1* | 9/2006 | Hoffman | H01L 29/66969 257/72 |
| 2007/0169812 A1* | 7/2007 | Robinson | C23C 18/1204 136/262 |
| 2009/0301344 A1 | 12/2009 | Chretien et al. | |

FOREIGN PATENT DOCUMENTS

| CN | 1459348 A | 12/2003 |
| JP | 2000-026120 A | 1/2000 |
| JP | 2003-193119 A | 7/2003 |
| JP | 2003-249131 A | 9/2003 |
| JP | 2003-261326 A | 9/2003 |
| JP | 2003-342602 A | 12/2003 |
| JP | 2006-164800 A | 6/2006 |
| JP | 2008-021616 A | 1/2008 |
| JP | 2009-293126 A | 12/2009 |
| KR | 10-2002-0086507 A | 11/2002 |
| KR | 2002-0086507 A | 11/2002 |
| KR | 10-0586660 B1 | 6/2006 |
| KR | 10-0759715 B1 | 9/2007 |
| KR | 10-2009-0127098 | 12/2009 |
| KR | 10-1096059 B1 | 12/2011 |
| KR | 10-1128009 B1 | 3/2012 |
| KR | 10-2013-0010848 A | 1/2013 |
| WO | WO 2009/040553 A2 | 4/2009 |

OTHER PUBLICATIONS

English text machine translation of Denda (JP 2008-021616). Accessed from Espacenet website Patent Translate feature, pp. 1-28 which includes the description and claims.*

Hongjin Jiang et al., "Tin/Indium nanobundle formation from aggregation or growth of nanoparticles", J Nanopart Res, Apr. 28, 2007, pp. 41-46, vol. 10 , Springer.

Y. Li et al., "$SnO_2/In_2O_3$ one-dimensional nano-core-shell structures: Synthesis, characterization and photoluminescence properties", Solid State Communications, Mar. 28, 2007, pp. 441-444, vol. 142, Elsevier Ltd.

* cited by examiner

Primary Examiner — Katie L Hammer

(57) ABSTRACT

Disclosed herein are a core-shell nano particle for formation of a transparent conductive film, a manufacturing method of the core-shell nano particle, and a manufacturing method of a transparent conductive film using the core-shell nano particle and, more particularly, a core-shell structured nano particle consisting of a core including indium or indium oxide and a shell including tin, a manufacturing method of the core-shell structured nano particle, and a manufacturing method of a transparent conductive film including (i) dispersing a core-shell structured nano particle into a solvent to manufacture a coating liquid, (ii) applying the coating liquid onto a substrate to form a coating layer, (iii) drying the coating layer, and (iv) performing an annealing process on the coating layer.

12 Claims, No Drawings

CORE-SHELL NANO PARTICLE FOR FORMATION OF TRANSPARENT CONDUCTIVE FILM, AND MANUFACTURING METHOD OF TRANSPARENT CONDUCTIVE FILM USING THE SAME

TECHNICAL FIELD

The present invention relates to a core-shell nano particle for formation of a transparent conductive film, a manufacturing method of the core-shell nano particle, and a manufacturing method of a transparent conductive film using the core-shell nano particle and, more particularly, to a core-shell structured nano particle consisting of a core including indium or indium oxide and a shell including tin, and a manufacturing method of a transparent conductive film including (i) dispersing a core-shell structured nano particle into a solvent to manufacture a coating liquid, (ii) applying the coating liquid onto a substrate to form a coating layer, (iii) drying the coating layer, and (iv) performing an annealing process on the coating layer.

BACKGROUND ART

A transparent conductive film exhibits high conductivity and high transmittance within a visible light range. For this reason, the transparent conductive film is used as an electrode for a solar cell, a liquid crystal display (LCD) device, an organic electroluminescent (EL) display, an inorganic EL display, a touch panel, and various light sensitive elements. In addition, the transparent conductive film is widely used in various fields, such as a solar reflective film and an antistatic protective film for vehicle windows or buildings.

For a transparent conductive film applied to a display device, particularly an organic EL display, low specific resistance and high flatness are required due to characteristics of the device. In particular, high flatness of the transparent conductive film is much more required than low specific resistance of the transparent conductive film due to a small thickness of an organic light emission layer thereof. For a transparent conductive film applied to a solar cell, on the other hand, efficiency of converting solar light to electricity is most important. For this reason, low specific resistance as well as high light transmittance of the transparent conductive film is requisite due to characteristics of the application field.

A transparent conductive film which has been industrially widely used is an indium oxide ($In_2O_3$) thin film. In particular, indium tin oxide (ITO), which is indium oxide including tin as a dopant, has been widely used since it is possible to easily manufacture a transparent conductive film exhibiting low resistance using the indium tin oxide (ITO).

The indium oxide ($In_2O_3$) transparent conductive film is generally manufactured using vacuum deposition methods, such as a sputtering method, a metal organic chemical vapor deposition (MOCVD) method, and an ion plasma method, and an aerosol spray pyrolysis method.

The sputtering method is effective in a case in which it is necessary to accurately control formation of a film using a material exhibiting low vapor pressure or the thickness of the film. Since it is very easy and convenient to manipulate the sputtering method, the sputtering method is industrially widely used. In the sputtering method, however, sputtering defects may be directly generated at a p type optical absorption layer located at the lower part of the film. In addition, it is difficult to use the vacuum deposition methods in producing large-sized products due to economical and technical problems caused when the size of a vacuum furnace is increased to a large scale. In the aerosol spray pyrolysis method, on the other hand, the thickness of the thin film is not uniform and it is difficult to control the size of coating particles with the result that transparency of products is lowered.

For this reason, there has been proposed a coating method for applying an application liquid to form a transparent conductive film, which is industrially applicable since it is easy to control the size of coating particles, formation of a thin film, and the thickness of the thin film at a low cost and it is possible to perform face-to-face coating.

During heat treatment of the application liquid, however, a lower layer may be denaturalized due to high-temperature heat treatment. In a case in which low-temperature heat treatment is carried out to prevent such a problem, arrangement of crystal particles in the thin film is not perfect with the result that polycrystalline growth may be caused. In addition, a final thin film exhibits a surface resistance of hundreds of ohm. That is, physical properties of the thin film are lowered as compared with the characteristics of the conventional transparent conductive film with the result that it is difficult to industrially apply the coating method.

Therefore, there is a high necessity for a method of manufacturing a transparent conductive film which can be carried out with lower cost than a conventional process of manufacturing a transparent conductive film, provide high material efficiency, and manufacture a transparent conductive film exhibiting physical properties equivalent to those of a conventional transparent conductive film.

DISCLOSURE

Technical Problem

The present invention has been made to solve the above problems and other technical problems that have yet to be resolved.

As a result of a variety of extensive and intensive studies and experiments to solve the problems as described above, the inventors of the present application have found out that, in a case in which a transparent conductive film is manufactured using a core-shell structured nano particle consisting of a core including indium or indium oxide and a shell including tin by a non-vacuum method, manufacturing process cost is lowered as compared with a conventional sputtering process, efficiency in using materials is improved, and the transparent conductive film exhibits performance equivalent to that of a transparent conductive film formed by the conventional sputtering process due to high reactivity of a precursor. The present invention has been completed based on these findings.

Technical Solution

In accordance with one aspect of the present invention, there is provided a core-shell structured nano particle consisting of a core including indium or indium oxide and a shell including tin.

A conventional indium tin oxide (ITO) nano particle has no material acting as a flux for accelerating sintering during a heat treatment process. For the core-shell structured nano particle, on the other hand, tin or indium has a low melting point and, therefore, tin or indium acts as a flux material during a sintering process with the result that material mobility is improved, whereby reactivity is improved. In a case in which a transparent conductive film is manufactured using the core-shell structured nano particle, therefore, it is possible to prevent overall deterioration of physical properties due to the increase of surface resistance.

In a concrete example, the core-shell structured nano particle may have a particle diameter of 10 nanometer to 100 nanometer and the core may have a particle diameter of 8 nanometer to 97 nanometer within a range of 80% to 97% the particle diameter of the entirety of the nano particle.

In a case in which the size of the core including indium or indium oxide is too large, a gap between particles is increased during a sintering process with the result that film density of a final thin film is lowered, which is not preferable. On the other hand, in a case in which the size of the core is too small, a coating property is lowered due to cohesion between nano particles, which is also not preferable.

In a concrete example, the shell may include at least one kind of dopant selected from a group consisting of tin, gallium, aluminum, titanium, niobium, tantalum, tungsten, molybdenum, and antimony.

The dopant may have a content equivalent to 1 weight % to 10 weight % the weight of the nano particle.

In a concrete example, the core-shell structured nano particle according to the present invention may be manufactured using a method including (i) preparing a first solution comprising a reducing agent, (ii) preparing a second solution comprising indium (In) salt, (iii) dropwise adding the first solution to the second solution such that the first solution and the second solution are reacted with each other, (iv) composing an indium (In) or indium oxide ($In_2O_3$) nano particle through the reaction, (v) preparing a third solution comprising tin (Sn) salt, and (vi) dropwise adding the third solution prepared at step (v) to a product comprising the nano particle composed at step (iv) to form a shell.

For example, the reducing agent may be an organic reducing agent and/or an inorganic reducing agent. Specifically, the reducing agent may be one selected from a group consisting of $LiBH_4$, $NaBH_4$, $KBH_4$, $Ca(BH_4)_2$, $Mg(BH_4)_2$, $LiB(Et)_3H_2$, $NaBH_3(CN)$, $NaBH(OAc)_3$, ascorbic acid, and triethanolamine.

In the manufacturing method of the core-shell structured nano particle according to the present invention, therefore, harmful hydrazine is not used to prepare a solution and, therefore, a risk which may occur in a conventional solution process may be removed.

In a concrete example, the first solution, the second solution, and the third solution each may include one or more solvents selected from a group consisting of water, methanol, ethanol, a glycol solvent, toluene, octadecene, and oleylamine.

The glycol solvent is not particularly restricted. For example, however, the glycol solvent may be any one selected from a group consisting of ethylene glycol, diethylene glycol (DEG), NMP, diethylene glycol mono ethyl ether (DEGMEE), and triethylene glycol.

In a concrete example, the indium (In) salt included in the second solution and the tin (Sn) salt included in the third solution may be one or more selected from a group consisting of chloride, nitrate, nitrite, sulfate, acetate, sulfite, acetylacetoante, and hydroxide.

Meanwhile, the indium (In) or indium oxide ($In_2O_3$) nano particle may be composed to have a desired size by dropwise adding the second solution including the indium (In) salt to the first solution including the reducing agent and reacting the first solution and the second solutions. At this time, the concentration of the indium (In) salt and the concentration of the reducing agent may be adjusted such that indium (In) or indium oxide ($In_2O_3$) may be composed.

Specifically, in an example, the indium (In) salt in the second solution may have a concentration of 0.01 M to 0.1 M and the reducing agent used to compose the indium (In) nano particle may have a concentration of 0.1 M to 1.0 M within a range of 2 to 10 times the concentration of the indium (In) salt.

In another example, the indium (In) salt in the second solution may have a concentration of 0.01 M to 0.1 M and the reducing agent used to compose the indium oxide ($In_2O_3$) nano particle may have a concentration of 0.001 M to 0.1 M within a range of 0.1 to 1 times the concentration of the indium (In) salt.

That is, in a case in which the concentration of the reducing agent is high as described above, reduction is almost perfectly achieved with the result that it is possible to compose the indium (In) nano particle. On the other hand, in a case in which the concentration of the reducing agent is low, indium (In) is not perfectly reduced with the result that an indium oxide ($In_2O_3$) nano particle having an oxide film formed at the surface of the indium (In) nano particle may be composed.

Even in a case in which, the indium (In) nano particle is composed, however, it is preferable for the concentration of the reducing agent not to exceed 10 times the concentration of the indium (In) salt, which is required to satisfactorily remove the reducing agent and a by-product during a refining process.

At this time, more particularly, the nano particle as the core may be an indium (In) nano particle. This is because, in a case in which the indium oxide ($In_2O_3$) nano particle is used as the core, sintering and necking between particles are not easily carried out during an annealing process after a coating film including the particles is formed since the indium oxide is an oxide particle and, in a case in which a metal material, such as the indium (In) nano particle, is used as the core, on the other hand, it is possible to more easily form a thin film having high density due to a melting phenomenon in which the indium having a low melting point (about 150° C.) melts during an annealing process.

In a concrete example, the reaction temperature necessary to compose the indium (In) or indium oxide ($In_2O_3$) nano particle may be 30 to 60° C.

According to circumstances, the second solution may further include a capping agent in addition to the indium (In) salt.

The capping agent may be included during a solution process and, therefore, the size and particle phase of the indium (In) or indium oxide ($In_2O_3$) nano particle may be controlled. In addition, the capping agent may include atoms, such as N, O, and S, and, therefore, the capping agent may be easily bound to the surface of the indium (In) or indium oxide ($In_2O_3$) nano particle through lone pair electrons of the atoms and surround the surface of the indium (In) or indium oxide ($In_2O_3$) nano particle. Consequently, oxidization of the nano particle may be prevented.

The capping agent is not particularly limited. For example, however, the capping agent may be one or more selected from a group consisting of sodium dodecylsulfate (SDS), L-tartrate dibasic dehydrate, potassium sodium tartrate, sodium acrylate, Poly(acrylic acid sodium salt), sodium citrate, trisodium citrate, disodium citrate, cetyltrimethylammonium bromide (CTAB), polyvinylpyrrolidone (PVP), sorbitol, triethyl phosphate, ethylene diamine, propylene diamine, 1,2-ethanedithiol, and ethanethiol.

In a concrete example, the capping agent in the second solution may have a concentration equivalent to 10 to 100 times the concentration of the indium (In) salt.

In a case in which the concentration of the capping agent is less than 10 times the concentration of the indium (In) salt, it may be difficult to maintain dispersibility of particles and, therefore, it may be difficult to form an indium (In) or indium oxide ($In_2O_3$) nano particle having a desired size. On the other hand, in a case in which the concentration of the capping agent is greater than 100 times the concentration of the indium (In) salt, it may be difficult to refine the indium (In) or indium oxide ($In_2O_3$) nano particle and purity of the particle may be lowered, which is not preferable.

Meanwhile, as can be seen from step (v), the indium (In) or indium oxide ($In_2O_3$) nano particle, which is a core particle manufactured through the above step, may be mixed with the third solution including the tin (Sn) salt to form a shell providing conductivity.

At this time, the coating thickness of the shell may be decided based on the mixing speed and the concentration of the tin (Sn) salt. In order for the particle diameter of the core to have a range of 80% to 97% the particle diameter of the entirety of the nano particle, the tin (Sn) salt included in the third solution may have a concentration set within a range in which a mole ratio of tin (Sn) to indium (In) is 0.08 to 0.1.

In addition, a metal salt may be further added to the third solution such that a dopant is further included into the core-shell structured nano particle.

The inventors of the present application have found out that the core-shell structured nano particle manufactured using the manufacturing method of the present invention has higher reactivity than a conventional ITO particle. In addition, as a result of a variety of extensive and intensive studies and experiments, the inventors of the present application have found out that, in a case in which a transparent conductive film is manufactured using the core-shell structured nano particle according to the present invention by a specific manufacturing method, the transparent conductive film exhibits performance equivalent to that of a transparent conductive film formed by a conventional sputtering process.

Therefore, the present invention also provides a manufacturing method of a transparent conductive film using the core-shell structured nano particle.

The manufacturing method of the transparent conductive film according to the present invention includes (i) dispersing a core-shell structured nano particle into a solvent to manufacture a coating liquid, (ii) applying the coating liquid onto a substrate to form a coating layer, (iii) drying the coating layer, and (iv) performing an annealing process on the coating layer.

In a concrete example, the solvent used at step (i) is not particularly restricted so long as the solvent exhibits high volatility while exhibiting high dispersion force on the core-shell structured nano particle. For example, the solvent may include one or more solvents selected from a group consisting of water, alcohol, ether, ketone, glycol, glycerol, and terfenol.

The step of forming the coating layer at step (ii) may be carried out using any one selected from a group consisting of wet coating, spray coating, spin-coating, doctor blade coating, contact printing, top feed reverse printing, bottom feed reverse printing, nozzle feed reverse printing, gravure printing, micro gravure printing, reverse micro gravure printing, roller coating, slot die coating, capillary coating, inkjet printing, jet deposition, and spray deposition.

At this time, the coating layer may be formed within a range in which sufficient transmittance of the coating layer is secured and the coating layer is not damaged. Specifically, the coating layer may have a thickness of 0.2 micrometer to 2.0 micrometer. More specifically, the coating layer may have a thickness of 0.5 micrometer to 2.0 micrometer.

The substrate may be changed based on a field in which the transparent conductive film is used. The substrate is not particularly restricted so long as thermal or laser annealing can be carried out on the substrate. For example, the substrate may be a glass substrate, a quartz substrate, or a plastic substrate. Specifically, in a case in which laser annealing is carried out, the substrate may be a plastic substrate or a glass substrate, which may be prevented from being heated when the penetration depth of a laser is reduced.

Meanwhile, the annealing process further reduces specific resistance of the coating layer in addition to formation of the thin film. In a concrete example, the annealing process may be carried out using thermal annealing or laser annealing in an air atmosphere or a nitrogen atmosphere. Specifically, the annealing process may be carried out using laser annealing. When the indium core is used, the method of forming indium oxide is achieved by annealing in an oxidizing atmosphere, such as an air atmosphere.

In a concrete example, the thermal annealing may be carried out within a temperature range of 200 to 500° C. for 30 minutes to 2 hours. In this case, resistance may be reduced while coarsening of the nano particle and reaction at an interface are prevented.

In another concrete example, the laser annealing may be carried out using a method of scanning a plus laser, such as an excimer laser, having large output or a method of using a solid laser, such as a Yag laser. The former has advantages in that mass productivity is high and industrial excellence is provided. On the other hand, the latter has advantages in that operation can be carried out with relatively low cost. Specifically, the laser may be, but is not limited to, a UV laser, an Nd-Yag laser, a disc laser, or a fiber laser.

Meanwhile, the wavelength, output, and scanning time of the laser may be considered so as to prevent thermal damage to the substrate or a lower layer and to achieve uniform annealing during the laser annealing. In a concrete example, the laser may have a wavelength range of 100 nanometer to 1000 nanometer. Specifically, the laser may have a wavelength range of 190 nanometer to 550 nanometer. Preferably, the laser annealing is carried out using an energy of 200 mJ or less for 0.1 seconds to 5 minutes.

In a case in which the laser annealing is carried out as described above, it is possible to transmit high energy only to the coating layer without increasing the temperature of the substrate and to achieve uniform crystallization, thereby fundamentally preventing denaturalization of the lower layer caused when a high-temperature heat treatment process is carried out or deterioration of physical properties caused during low-temperature heat treatment. Consequently, it is possible to manufacture a transparent conductive film exhibiting excellent physical properties.

In a concrete example, therefore, the laser used for the laser annealing may have a visible light wavelength so as to transmit high energy only to the coating layer without increasing the temperature of the substrate and to prevent denaturalization of the lower layer.

The present invention also provides a transparent conductive film manufactured using the manufacturing method as described above.

The transparent conductive film may be manufactured using a core-shell structured nano particle consisting of a core including indium or indium oxide and a shell including tin. Consequently, the transparent conductive film may be made of indium tin oxide (ITO).

In a case in which the indium core is used as previously described, indium is melted during annealing in an air atmosphere and, therefore, indium oxide is formed during a process of forming a thin film.

Meanwhile, the most important properties required by the transparent conductive film may include specific resistance and light transmittance. In a concrete example, the transparent conductive film according to the present invention may have a specific resistance of 0.001 Ωcm to 0.01 Ωm.

In a case in which the specific resistance of ITO is greater than 0.01 Ωcm, physical properties, including efficiency, are lowered. On the other hand, it is difficult to manufacture the transparent conductive film such that the specific resistance of the transparent conductive film is less than 0.001 Ωcm due to limitations in material and process.

In another concrete example, the transparent conductive film according to the present invention may have an average visible light (400 to 800 nm) transmittance of 80% or more. In a case in which the light transmittance of the transparent conductive film is less than 80%, the transparent conductive film cannot properly function as mentioned in the background art.

Furthermore, the present invention may be applicable to various devices using the transparent conductive film. For example, the present invention provides a solar cell or a liquid crystal display device including the transparent conductive film A method of manufacturing the solar cell or the liquid crystal display device is well known in the art to which the present invention pertains and, therefore, a detailed description thereof will be omitted.

BEST MODE

Now, the present invention will be described in more detail with reference to the following examples. These examples are provided only for illustration of the present invention and should not be construed as limiting the scope and spirit of the present invention.

Manufacture Example 1

Composition of In-Core-Sn-Shell Nano Particle

A water solution including 13.5 mmol of $InCl_3$ and 50 mmol of sodium dodecylsulfate (SDS) was slowly dropwise added to a water solution including 150 mmol of $NaBH_4$ for 1 hour and then the mixed water solutions were reacted with each other while being stirred for 24 hours to form a particle. Subsequently, a water solution including 1.5 mmol of $SnCl_2$ was slowly dropwise added to the reacted water solutions and then the mixed water solutions were reacted with each other while being stirred for 1 hour and was refined using a centrifugal separation method to manufacture a core-shell structured In-core-Sn-shell nano particle.

Examples 1 to 3 and Comparative Examples 1 and 2

Manufacture of Transparent Conductive Film Sample

Samples were prepared on glass substrates according to deposition methods (IS means In-core-Sn-shell nano particle and ITO means indium oxide nano particle including tin), thickness conditions, and annealing treatment conditions as shown in Table 1.

TABLE 1

| | Deposition method | Thickness (micrometer) | Annealing condition Type | Conditions |
|---|---|---|---|---|
| Example 1 | Glass substrate - IS particle coating | 5.0/1.0 | Laser annealing | UV laser, 10.6 µm, 1 minute, 5 W, and air atmosphere |
| Example 2 | Glass substrate - IS particle coating | 5.0/1.0 | Laser annealing | UV laser, 10.6 µm, 2 minutes, 6 W, and air atmosphere |
| Example 3 | Glass substrate - IS particle coating | 5.0/1.0 | Thermal annealing | 220° C., 1 hour, and air atmosphere |
| Comparative example 1 | Glass substrate - ITO particle coating | 5.0/1.0 | Thermal annealing | 220° C., 4 hours, and air atmosphere |
| Comparative example 2 | Glasssubstrate - ITO thin film sputtering | 1.0 | Sputtering | None |

Experimental Example 1

After the samples were prepared as shown in Table 1, surface resistance, specific resistance, and (optical) transmittance of the samples were measured, which are shown in Table 2.

TABLE 2

| | Surface resistance ($\Omega/cm^2$) | Specific resistance ($\Omega cm$) | Transmittance (%) |
|---|---|---|---|
| Example 1 | 975 | 0.0975 | 80 |
| Example 2 | 512 | 0.0512 | 70 |
| Example 3 | 2000 | 0.2 | 80 |
| Comparative example 1 | 3000 | 0.3 | 80 |
| Comparative example 2 | 10 | 0.001 | 85 |

It can be seen from Table 2 that there is a possibility that Examples 1 and 2 exhibit surface resistance, specific resistance, and light transmittance equivalent to those of Comparative example 2 although Examples 1 and 2 formed the transparent conductive films using a non-vacuum coating process without using a conventional sputtering process which was used in Comparative example 2. In addition, it can be seen that Examples 1 and 2 exhibit much lower surface resistance and specific resistance than Comparative example 1, in which the conventional ITO nano particle was used and the thermal annealing coating process was carried out, and have a very small loss in optical transmittance. Furthermore, it can be seen that Example 3, in which thermal annealing was carried out instead of laser annealing, exhibits surface resistance and specific resistance higher than those acquired by the laser annealing but lower surface resistance and specific resistance than Comparative example 1, in which the conventional ITO nano particle was used.

Moreover, comparison between Examples 1 and 2 shows that it is possible to exhibit more excellent surface resistance, specific resistance, and light transmittance through optimization of the laser annealing conditions. In addition, comparison among Examples 1, 2, and 3 shows that effects acquired when the laser annealing is carried out are more excellent than effects acquired when the thermal annealing is carried out.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims.

INDUSTRIAL APPLICABILITY

As is apparent from the above description, in a case in which through an annealing process is carried out on a core-shell structured nano particle consisting of a core including indium or indium oxide and a shell including tin according to the present invention to manufacture a transparent conductive film, it is possible to manufacture the transparent conductive film using a non-vacuum manufacturing process, thereby reducing manufacturing process costs as compared with a conventional sputtering process and improving efficiency in use of materials.

In addition, the core-shell structured nano particle, which is consisting of the core including indium or indium oxide and the shell including tin, exhibits high reactivity. Although the transparent conductive film is formed using the non-vacuum manufacturing process, therefore, the transparent conductive film may exhibit the same performance as a transparent conductive film formed using the conventional sputtering process.

The invention claimed is:

1. A manufacturing method of a transparent conductive film using a core-shell structured nano particle, the manufacturing method comprising:
   (i) dispersing core-shell structured nano particles with a core that includes indium and a shell that includes tin into a solvent to manufacture a coating liquid;
   (ii) applying the coating liquid onto a substrate to form a coating layer;
   (iii) drying the coating layer; and
   (iv) sintering the nano particles by performing an annealing process on the coating layer at a pressure of at least atmospheric pressure in atmosphere,
   wherein the annealing process is carried out using laser annealing, and
   wherein a laser used for the laser annealing has a visible light wavelength.

2. The manufacturing method according to claim 1, wherein the solvent comprises one or more solvents selected from a group consisting of water, alcohol, ether, ketone, glycol, glycerol, and terfenol.

3. The manufacturing method according to claim 1, wherein the coating layer has a thickness of 0.2 micrometer to 2.0 micrometer.

4. The manufacturing method according to claim 1, wherein the substrate is a plastic substrate or a glass substrate.

5. The manufacturing method according to claim 1, wherein a laser used for the laser annealing is an Nd-Yag laser, a disc laser, or a fiber laser.

6. The manufacturing method according to claim 1, wherein the laser annealing is carried out for 0.1 seconds to 5 minutes.

7. A transparent conductive film manufactured by a manufacturing method according to claim 1.

8. The transparent conductive film according to claim 7, wherein the transparent conductive film is made of indium tin oxide (ITO).

9. The transparent conductive film according to claim 7, wherein the transparent conductive film has a specific resistance of 0.001 $\Omega$cm to 0.01 $\Omega$cm.

10. The transparent conductive film according to claim 7, wherein the transparent conductive film has an average transmittance of 80% or more in a light spectrum of 400 to 800 nm.

11. A solar cell comprising a transparent conductive film according to claim 7.

12. A liquid crystal display device comprising a transparent conductive film according to claim 7.

* * * * *